US012672340B2

(12) United States Patent
Chen et al.

(10) Patent No.: US 12,672,340 B2
(45) Date of Patent: Jun. 30, 2026

(54) CAPACITOR ON FIN STRUCTURE AND FABRICATING METHOD OF THE SAME

(71) Applicant: UNITED MICROELECTRONICS CORP., Hsin-Chu City (TW)

(72) Inventors: Hsin-Yu Chen, Nantou County (TW); Chun-Hao Lin, Kaohsiung City (TW); Yuan-Ting Chuang, Yilan County (TW); Shou-Wei Hsieh, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 614 days.

(21) Appl. No.: 18/078,064

(22) Filed: Dec. 8, 2022

(65) Prior Publication Data
US 2024/0162220 A1 May 16, 2024

(30) Foreign Application Priority Data
Nov. 10, 2022 (CN) .......................... 202211407799.7

(51) Int. Cl.
| | |
|---|---|
| *H01L 27/06* | (2006.01) |
| *H01L 21/8234* | (2006.01) |
| *H10D 1/00* | (2025.01) |
| *H10D 1/68* | (2025.01) |
| *H10D 84/01* | (2025.01) |
| *H10D 84/03* | (2025.01) |
| *H10D 84/80* | (2025.01) |

(52) U.S. Cl.
CPC .......... *H10D 84/811* (2025.01); *H10D 1/042* (2025.01); *H10D 1/696* (2025.01); *H10D 1/714* (2025.01); *H10D 1/716* (2025.01); *H10D 84/0149* (2025.01); *H10D 84/038* (2025.01)

(58) Field of Classification Search
CPC ........ H10D 1/696; H10D 1/665; H10D 1/047; H10D 1/042; H10D 1/041; H10D 84/813
See application file for complete search history.

(56) References Cited

U.S. PATENT DOCUMENTS

| | | |
|---|---|---|
| 10,867,994 B2 | 12/2020 | Shi |
| 2015/0145103 A1* | 5/2015 | Chou ..................... H10D 1/665 |
| | | 438/387 |

* cited by examiner

*Primary Examiner* — John A Bodnar
(74) *Attorney, Agent, or Firm* — Winston Hsu

(57) ABSTRACT

A capacitor on a fin structure includes a fin structure. A dielectric layer covers the fin structure. A first electrode extension is embedded within the fin structure. A first electrode penetrates the dielectric layer and contacts the first electrode extension. A second electrode and a capacitor dielectric layer are disposed within the dielectric layer. The capacitor dielectric layer surrounds the second electrode, and the capacitor dielectric layer is between the second electrode and the first electrode extension.

8 Claims, 10 Drawing Sheets

FIG. 3

CAPACITOR ON FIN STRUCTURE AND FABRICATING METHOD OF THE SAME

BACKGROUND OF THE INVENTION

1. Field of the Invention

The present invention relates to a capacitor on a fin structure and a fabricating method of the same, and more particularly to a fabricating method of forming a plate capacitor on a fin structure.

2. Description of the Prior Art

Metal-oxide-semiconductor capacitors (MOS capacitors) are used in many applications, such as analog filters and circuit devices which includes operational transconductance amplifiers and capacitors.

Generally speaking, the manufacturing process of a MOS capacitor includes forming a capacitor dielectric layer and electrodes on a substrate. In order to maintain a stable capacitance (to make the MOS capacitor have the same capacitance under different voltages). It is necessary to implant a high concentration of dopants in the substrate. However, high concentration of dopants is easy to cause breakdown of the capacitor dielectric layer, especially in the fin structure. Therefore, a MOS capacitor with a high concentration of dopants in the fin structure will not only damage the fin structure, but also make the capacitor dielectric layer more likely to break down.

SUMMARY OF THE INVENTION

In view of this, the present invention provides a fabricating method of a capacitor on a fin structure to solve problems mentioned above.

According to a preferred embodiment of the present invention, a capacitor on a fin structure includes a fin structure. A dielectric layer covers the fin structure. A first electrode extension is embedded within the fin structure. A first electrode penetrates the dielectric layer and contacts the first electrode extension. A second electrode is disposed within the dielectric layer. A capacitor dielectric layer is disposed within the dielectric layer and the capacitor dielectric layer surrounds the second electrode, wherein the capacitor dielectric layer is between the second electrode and the first electrode extension.

According to another preferred embodiment of the present invention, a fabricating method of a capacitor on a fin structure includes providing a fin structure, wherein a first electrode extension is embedded within the fin structure, and a dielectric layer covers the fin structure. Next, a first electrode is formed to penetrate the dielectric layer and contact the first electrode extension. Then, a contact hole is formed within the dielectric layer and exposes the first electrode extension. Later, a capacitor dielectric layer is formed to cover the contact hole and contact the first electrode extension. Finally, a second electrode is formed to filling to the contact hole.

According to yet another preferred embodiment of the present invention, a fabricating method of a capacitor and a plug on a fin structure includes providing a fin structure divided into a transistor region and a capacitor region, wherein a transistor is disposed within the transistor region, the transistor includes a gate disposed on the fin structure, two source/drain doped regions are embedded within the fin structure at two sides of the gate, a first electrode extension is embedded within the capacitor region of the fin structure, and a dielectric layer covers the transistor region and the capacitor region. Then, a first etching is performed, wherein the first etching includes etching the dielectric layer to form two first contact holes and a second contact hole, each of the two first contact holes exposes one of the two source/drain doped regions, and the second contact hole exposes the first electrode extension. Later, a barrier is formed to cover the two first contact holes and the second contact hole. Thereafter, a first metal layer is formed to fill in the two first contact holes and the second contact hole, wherein the first metal layer contacts the barrier. Subsequently, a second etching is performed, wherein the second etching includes etching the dielectric layer to form a third contact hole, and the first electrode extension is exposed through the third contact hole. After that, a capacitor dielectric layer is formed to cover the third contact hole and contact the first electrode extension. Finally, a second metal layer is formed to fill into the third contact hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of a capacitor and a plug on a fin structure according to a preferred embodiment of the present invention, wherein:

FIG. 1 depicts a fin structure;

FIG. 2 depicts a fabricating stage following FIG. 1;

FIG. 3 depicts a fabricating stage following FIG. 2;

FIG. 4 depicts a fabricating stage following FIG. 3;

FIG. 5 depicts a fabricating stage following FIG. 4;

FIG. 6 depicts a fabricating stage following FIG. 5;

FIG. 7 depicts a fabricating stage following FIG. 6; and

FIG. 8 depicts a fabricating stage following FIG. 7.

DETAILED DESCRIPTION

FIG. 1 to FIG. 8 depict a fabricating method of a capacitor and a plug on a fin structure according to a preferred embodiment of the present invention.

Figure 1:
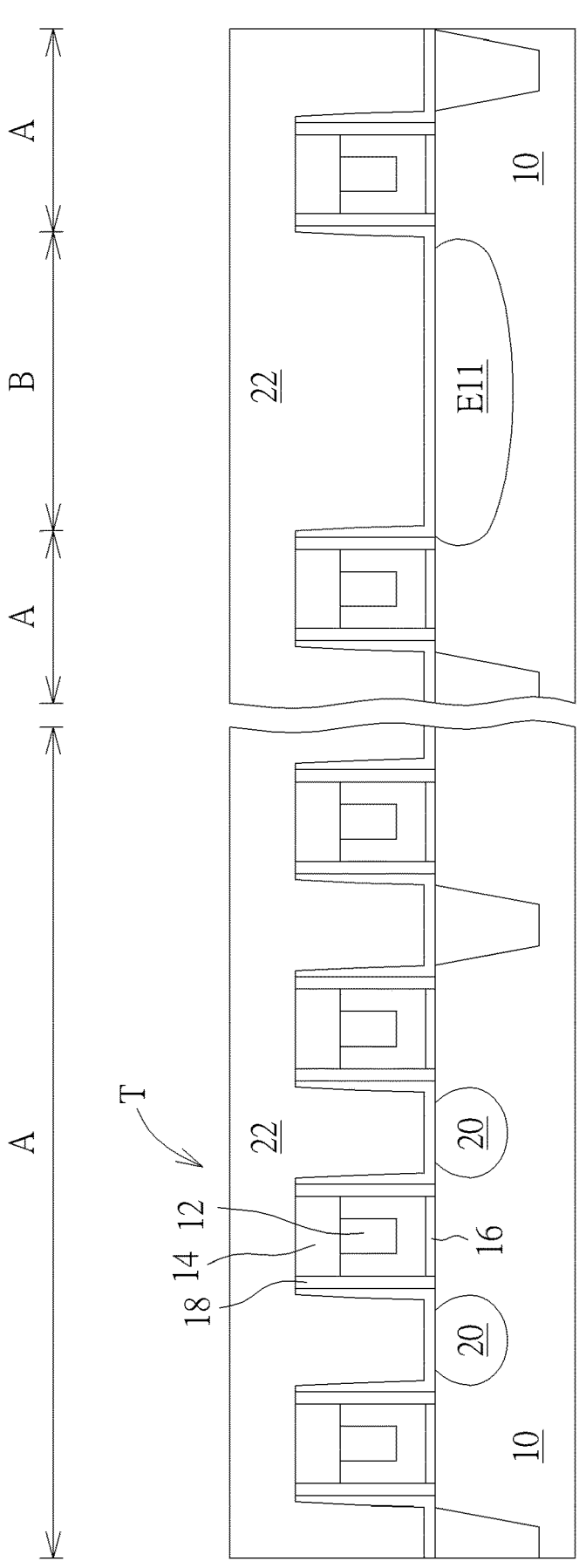

As shown in FIG. 1, a fin structure 10 is provided. The fin structure 10 is semiconductor material such as silicon, germanium, gallium arsenide, silicon germanium, indium phosphide, etc. The fin structure 10 is divided into a transistor region A and a capacitor region B. A transistor T is disposed within the transistor region A. The transistor T includes a gate 12 disposed on the fin structure 10. A cap layer 14 covers the gate 12. A gate dielectric layer 16 is disposed between the fin structure 10 and the gate 12. Two spacers 18 are respectively disposed at two sides of the gate 12. Two source/drain doped regions 20 are embedded within the fin structure 10 at two sides of the gate 12. A first electrode extension E11 is embedded within the capacitor region B of the fin structure 10. The first electrode extension E11 and the source/drain doped regions 20 are formed by the same fabricating step. The first electrode extension E11 and the source/drain doped regions 20 may be doped regions or epitaxial layers. A dielectric layer 22 covers the capacitor region B and the transistor region A of the fin structure 10, and covers the gate 12.

Figure 2:
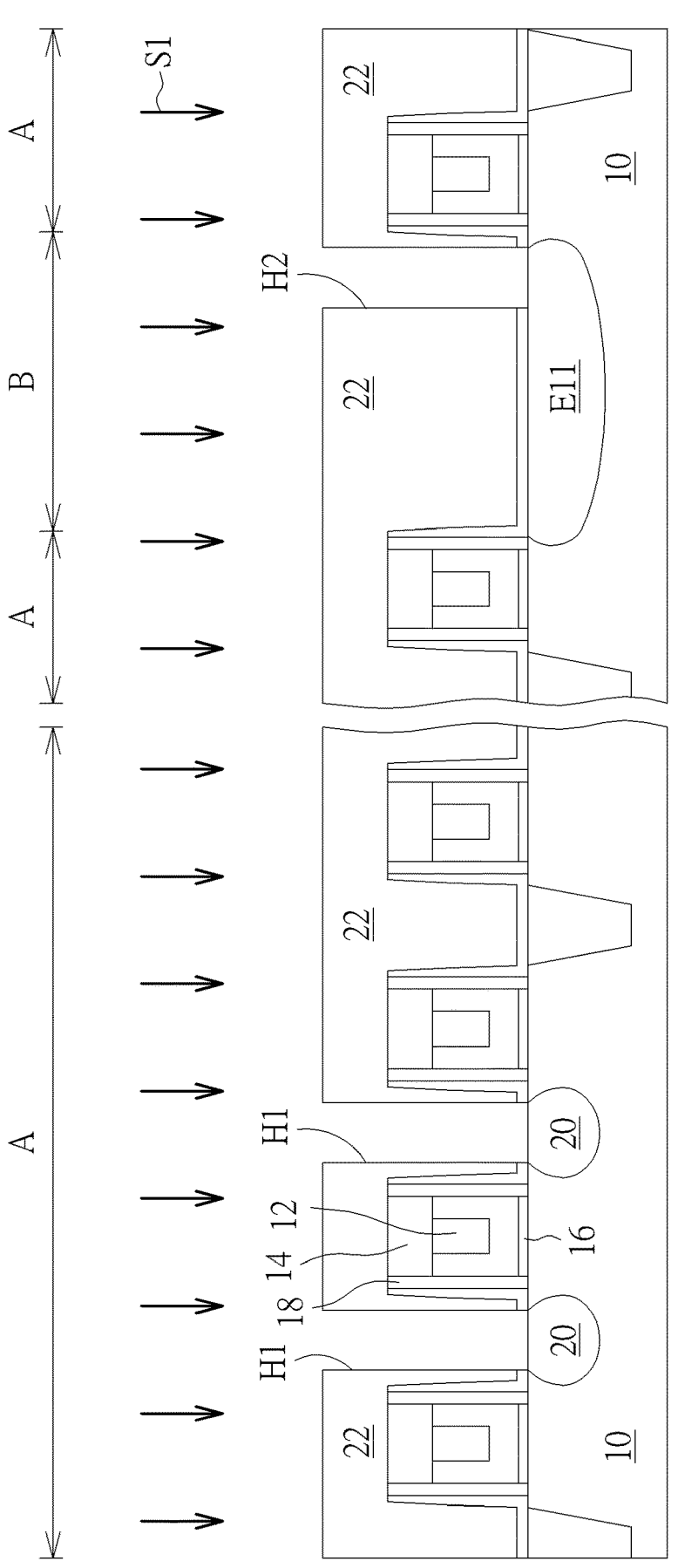
Figure 3:
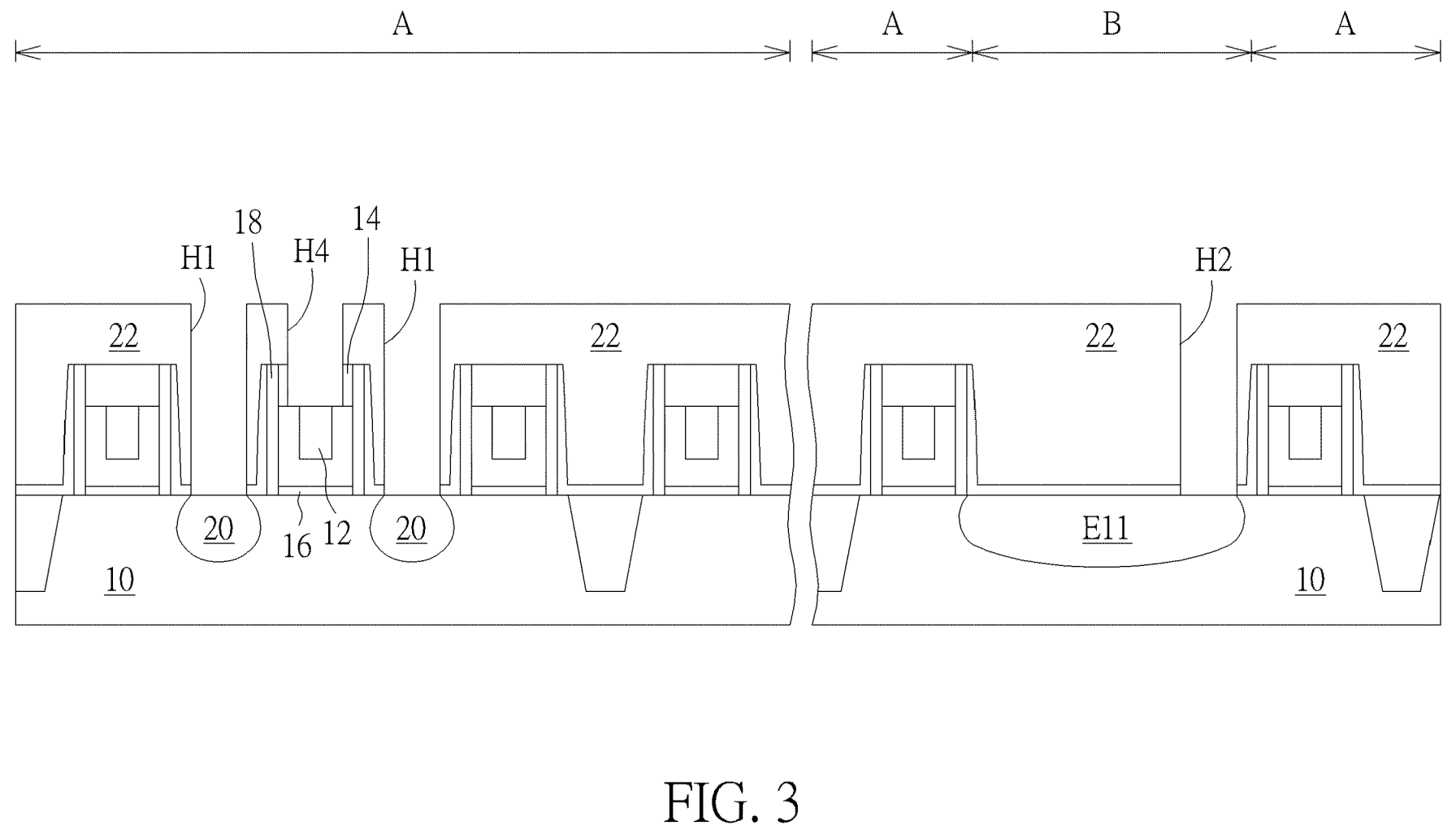
Figure 4:
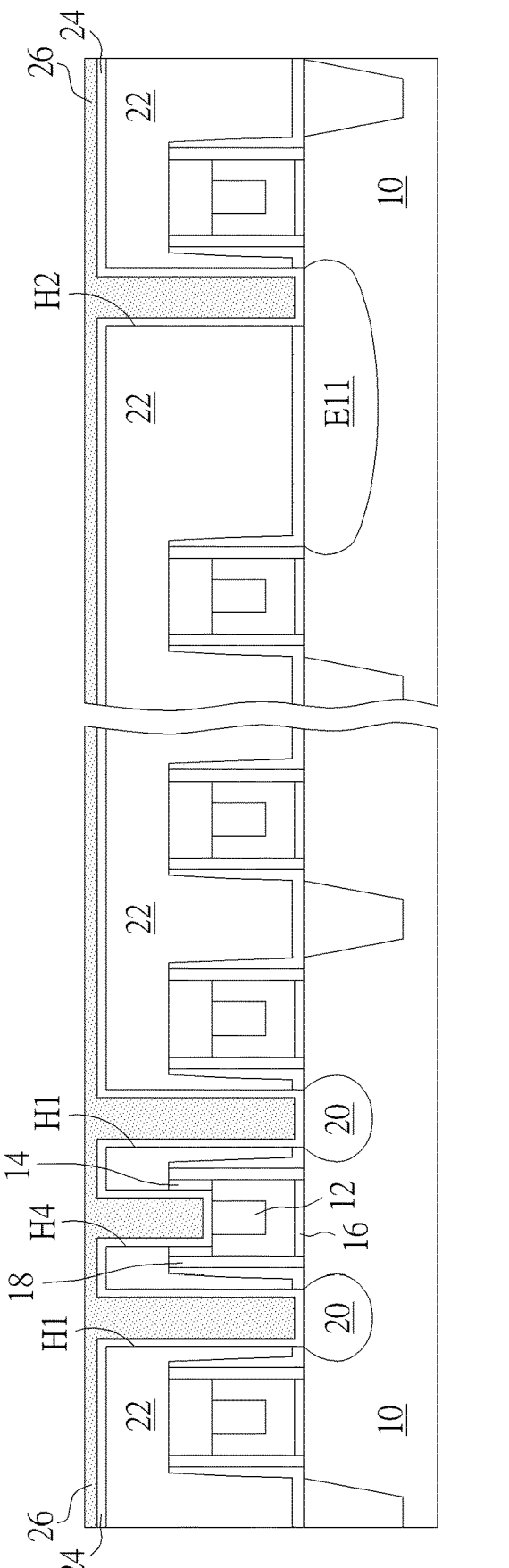

As shown in FIG. 2, a first etching S1 is performed. The first etching S1 includes etching the dielectric layer 22 to form two first contact holes H1 and a second contact hole H2. Each of the two first contact holes H1 exposes one of the source/drain doped regions 20. The second contact hole H2 exposes the first electrode extension E11. As shown in FIG. 3, the dielectric layer 22 and the cap layer 14 are etched to form a fourth contact hole H4, and the gate 12 is exposed through the fourth contact hole H4. As shown in FIG. 4, a barrier 24 is formed to conformally cover the two first contact holes H1, the second contact hole H2, the fourth contact hole H4, and a top surface of the dielectric layer 22. Next, a first metal layer 26 fills in the two first contact holes H1 and the second contact hole H2 and the fourth contact hole H4, wherein the first metal layer 26 contacts the barrier 24.

Figure 5:
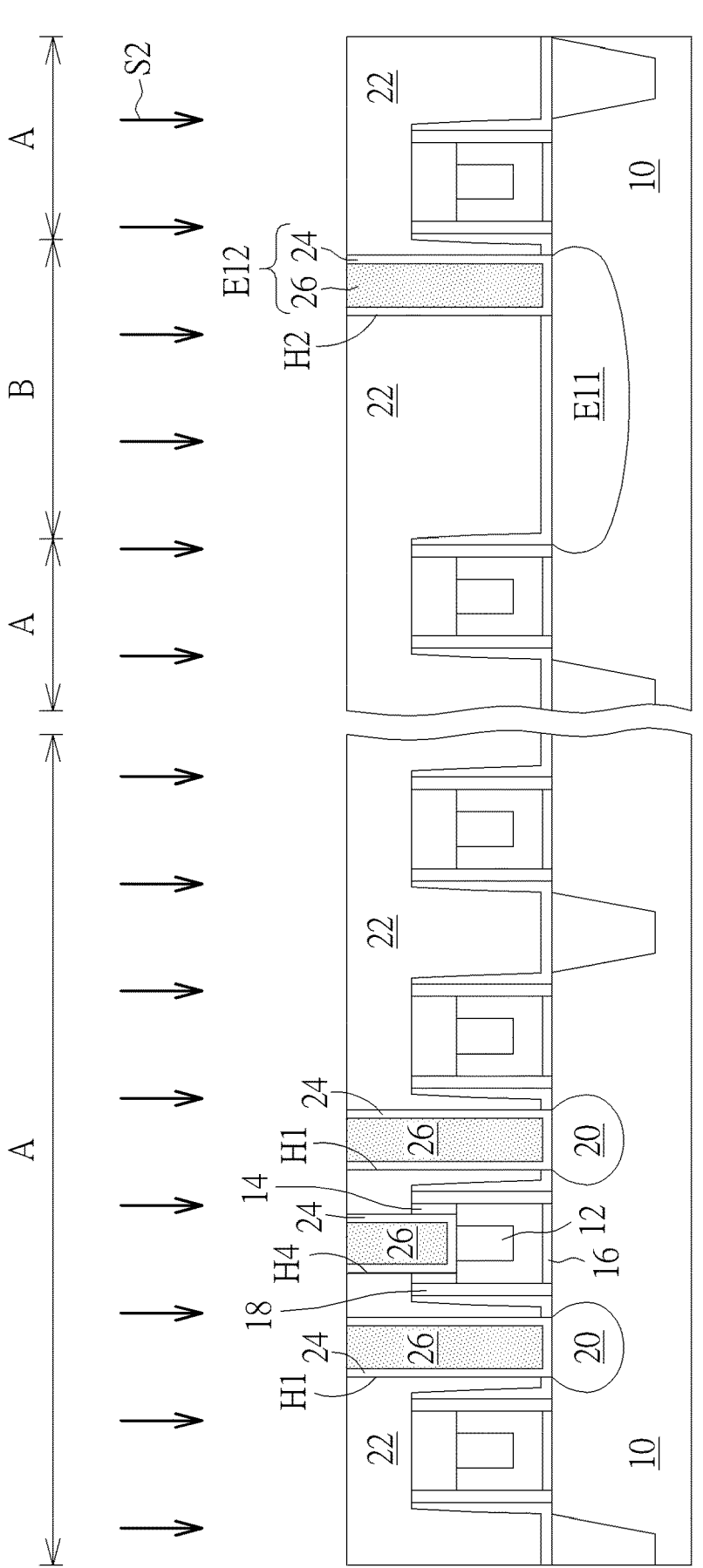
Figure 6:
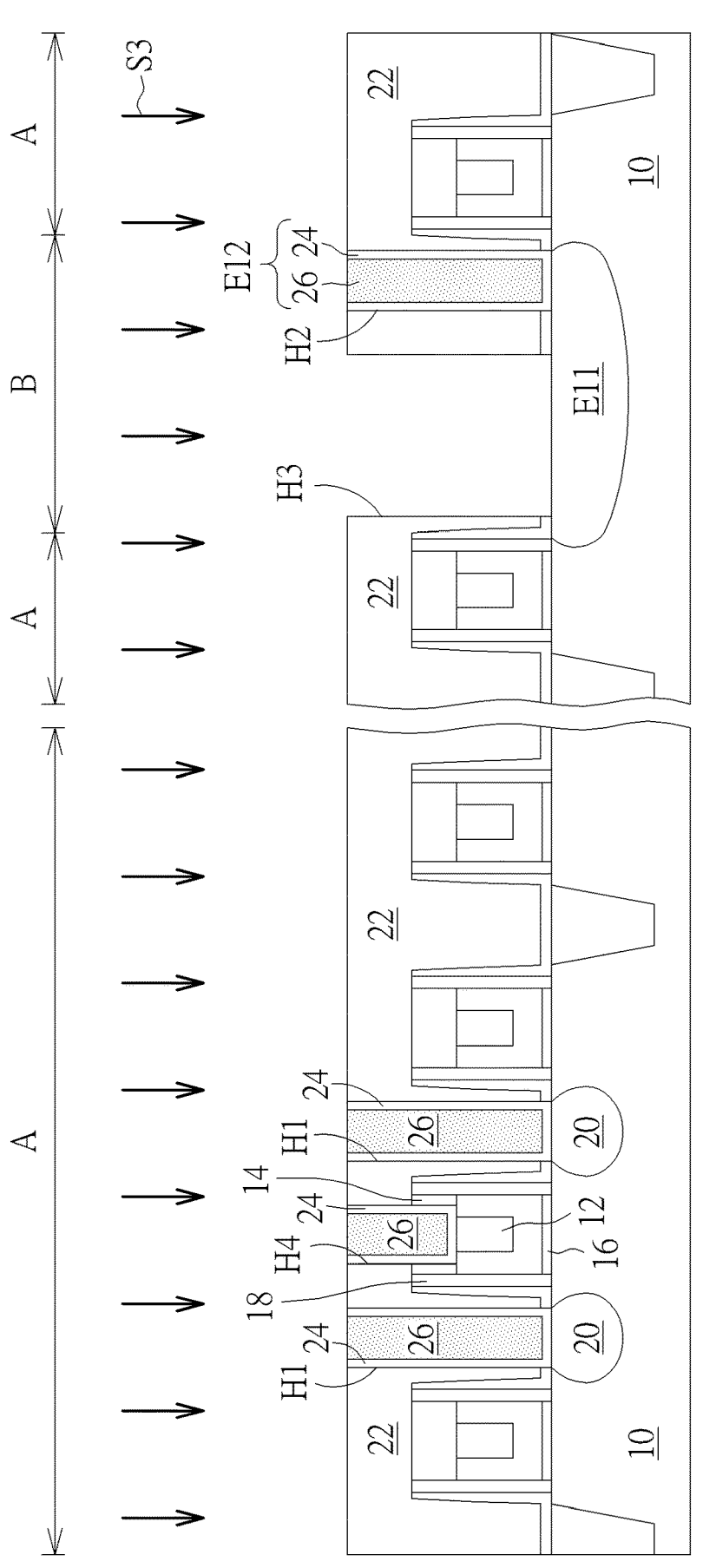
Figure 7:
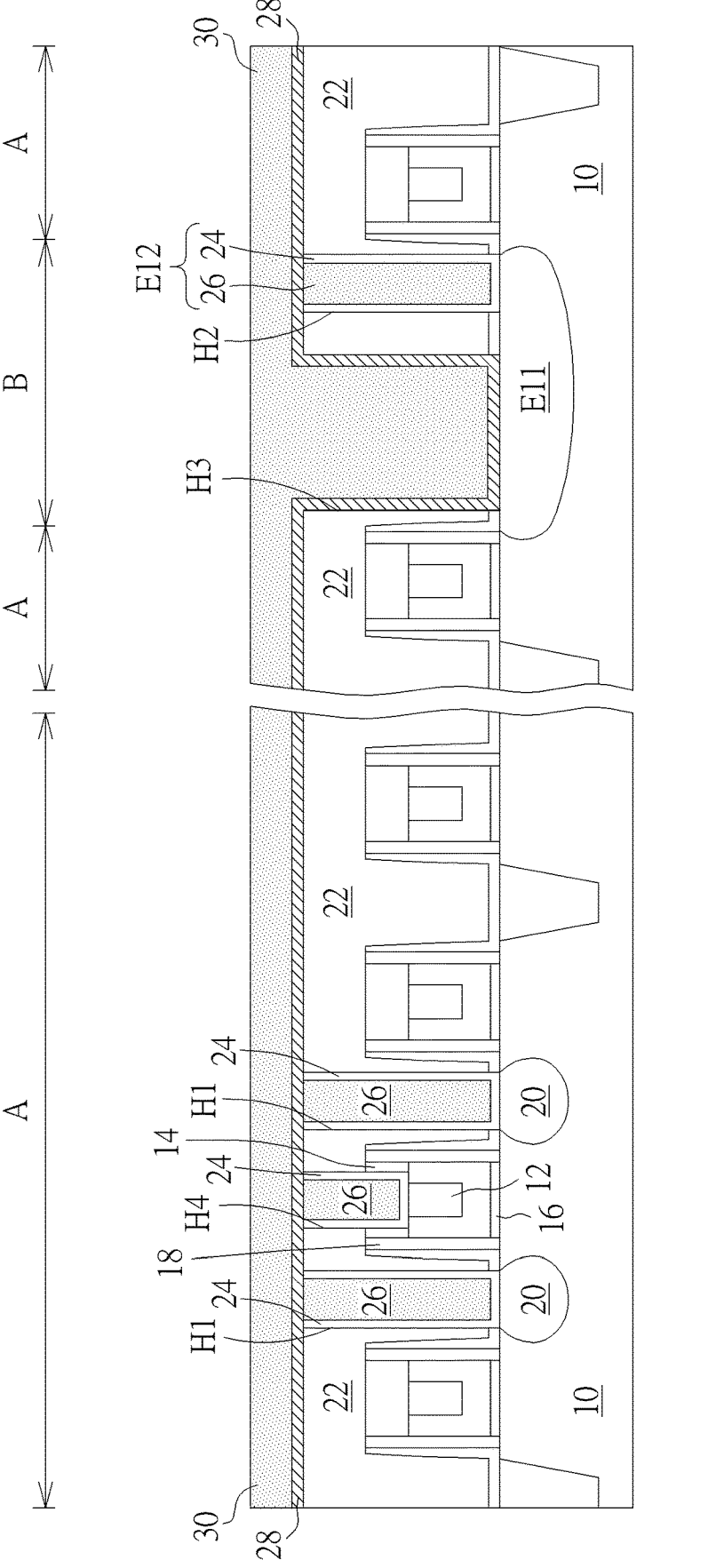
Figure 8:
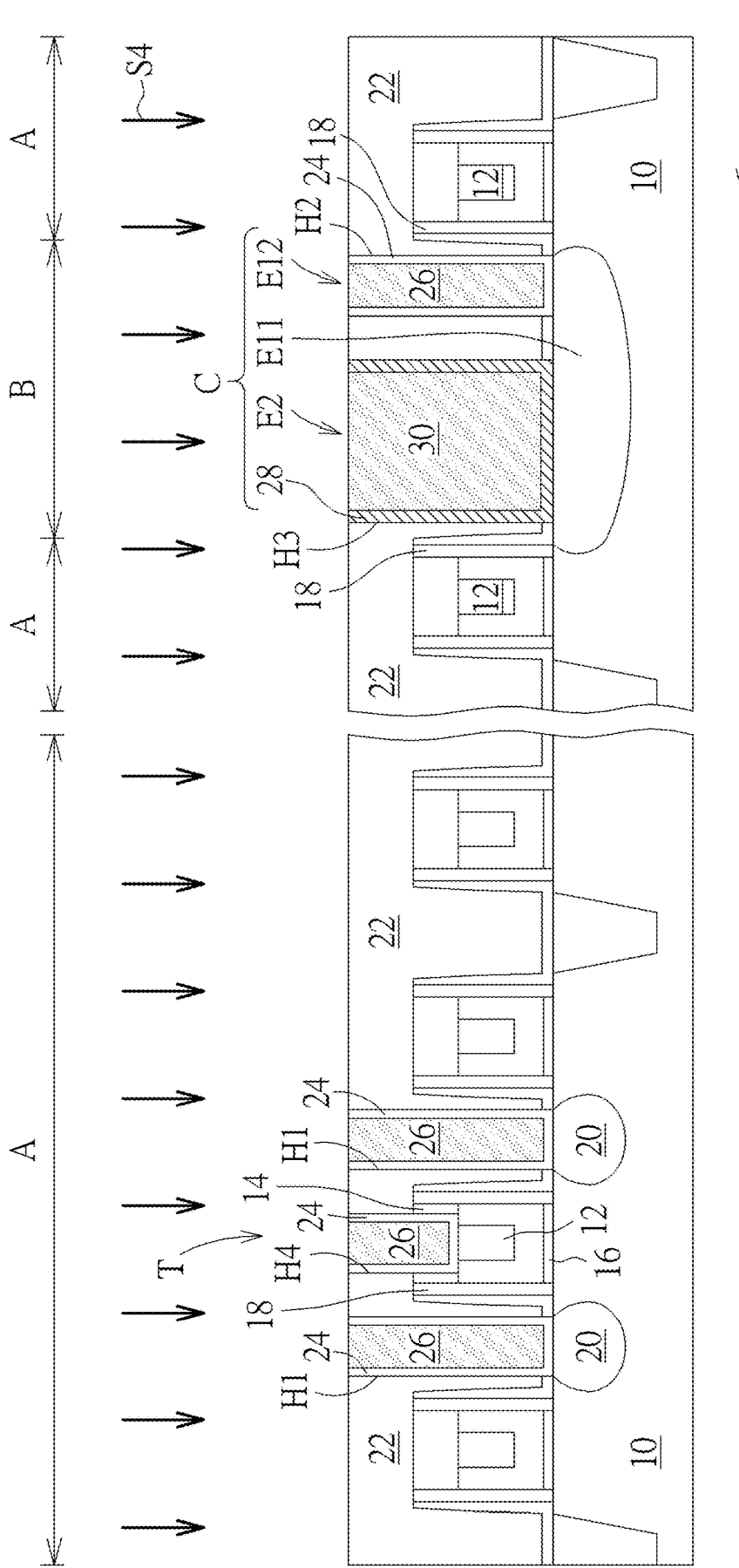

As shown in FIG. 5, a planarization process S2 is performed to remove the barrier 24 and the first metal layer 26 which are outside of the two first contact holes H1 and the second contact hole H2 to make the top surface of the first metal layer 26 and the top surface of the dielectric layer 22 aligned with each other. Now, the first metal layer 26 and the barrier 24 remained within the first contact holes H1 serve as contact plugs for the source/drain doped regions 20. The first metal layer 26 and the barrier 24 remained within the fourth contact hole H4 serve as a gate plug. The first metal layer 26 and the barrier 24 remained within the second contact hole H2 serve as a first electrode E12. As shown in FIG. 6, a second etching S3 is performed. The second etching S3 includes etching the dielectric layer 22 to form a third contact hole H3 within the capacitor region B, and the first electrode extension E11 is exposed through the third contact hole H3. As shown in FIG. 7, a capacitor dielectric layer 28 is formed to conformally cover the third contact hole H3 and the dielectric layer 22, and contact the first electrode extension E11. Later, a second metal layer 30 is formed to cover the dielectric layer 22 and fill into the third contact hole H3. As show in FIG. 8, a planarization process S4 is performed to remove the second metal layer 30 and the capacitor dielectric layer 28 which are outside of the third contact hole H3 to make the top surface of the second metal layer 30 aligned with the top surface of the dielectric layer 22. Now, the second metal layer 30 remained within the third contact hole H3 serves as a second electrode E2. The first electrode extension E11, the first electrode E12, the capacitor dielectric layer 28 and the second electrode E2 together form a capacitor C. It is noteworthy that a first direction D1 is parallel to the top surface of the fin structure 10. Along the first direction D1, there is no gate between the first electrode E12 and the second electrode E2. Now, the fabricating method of a capacitor and a plug on a fin structure of the present invention is completed. Although the fabricating method described above is a combination process of a capacitor and a plug on a fin structure; however, the capacitor can be manufactured independently on the fin structure without combining the fabrication of the plug. That is, only processes within the capacitor region in FIG. 1 to FIG. 8 are performed. For example, as shown in FIG. 1, a fin structure 10 is provided. A first electrode extension E11 is embedded within the fin structure 10. A dielectric layer 22 covers the fin structure 10. Later, as shown in FIG. 5, a first electrode E12 is formed to penetrate the dielectric layer 22 and contact the first electrode extension E11. Next, as shown in FIG. 6, a third contact hole H3 is formed in the dielectric layer 22 and the first electrode extension E11 is exposed through the third contact hole H3. Thereafter, as shown in FIG. 8, a capacitor dielectric layer 28 is formed to cover the third contact hole H3 and contact the first electrode extension E11. Finally, a second electrode E2 is formed to fill in the third contact hole H3.

FIG. 8 depicts a capacitor on a fin structure according to a first preferred embodiment of the present invention. As shown in FIG. 8, a fin structure 10 is provided, and a capacitor C is disposed on the fin structure 10. Two gates 12 are disposed on the fin structure 10. The capacitor C is disposed between the gates 12. Two spacers 18 are disposed at two sides of each of the gates 12. A dielectric layer 22 covers the fin structure 10 and the gates 12. A first electrode extension E11 is embedded within the fin structure 10. Part of the first electrode extension E11 overlaps one of the spacers 18. The first electrode extension E11 includes a doped region or an epitaxial layer. A first electrode E12 penetrates the dielectric layer 22 and contacts the first electrode extension E11. A second electrode E2 is disposed within the dielectric layer 22. A capacitor dielectric layer 28 is disposed within the dielectric layer 22 and the capacitor dielectric layer 28 surrounds the second electrode E2, wherein the capacitor dielectric layer 28 is between the second electrode E2 and the first electrode extension E11, and between the second electrode E2 and the dielectric layer 22. The capacitor dielectric layer 28 physically contacts the first electrode extension E11. A first direction D1 is parallel to a top surface of the fin structure 10, along the first direction D1, there is no gate between the first electrode E12 and the second electrode E2. The first electrode E12 includes a first metal layer 26 and a barrier 24. The second electrode E2 includes a second metal layer 30. The first meal layer 26 and the second metal layer 30 are preferably W. The barrier 24 is preferably a Ti/TiN stacked layer. The capacitor dielectric layer 28 includes silicon oxide, silicon nitride, silicon oxynitride, aluminum oxide or hafnium oxide.

Figure 9:
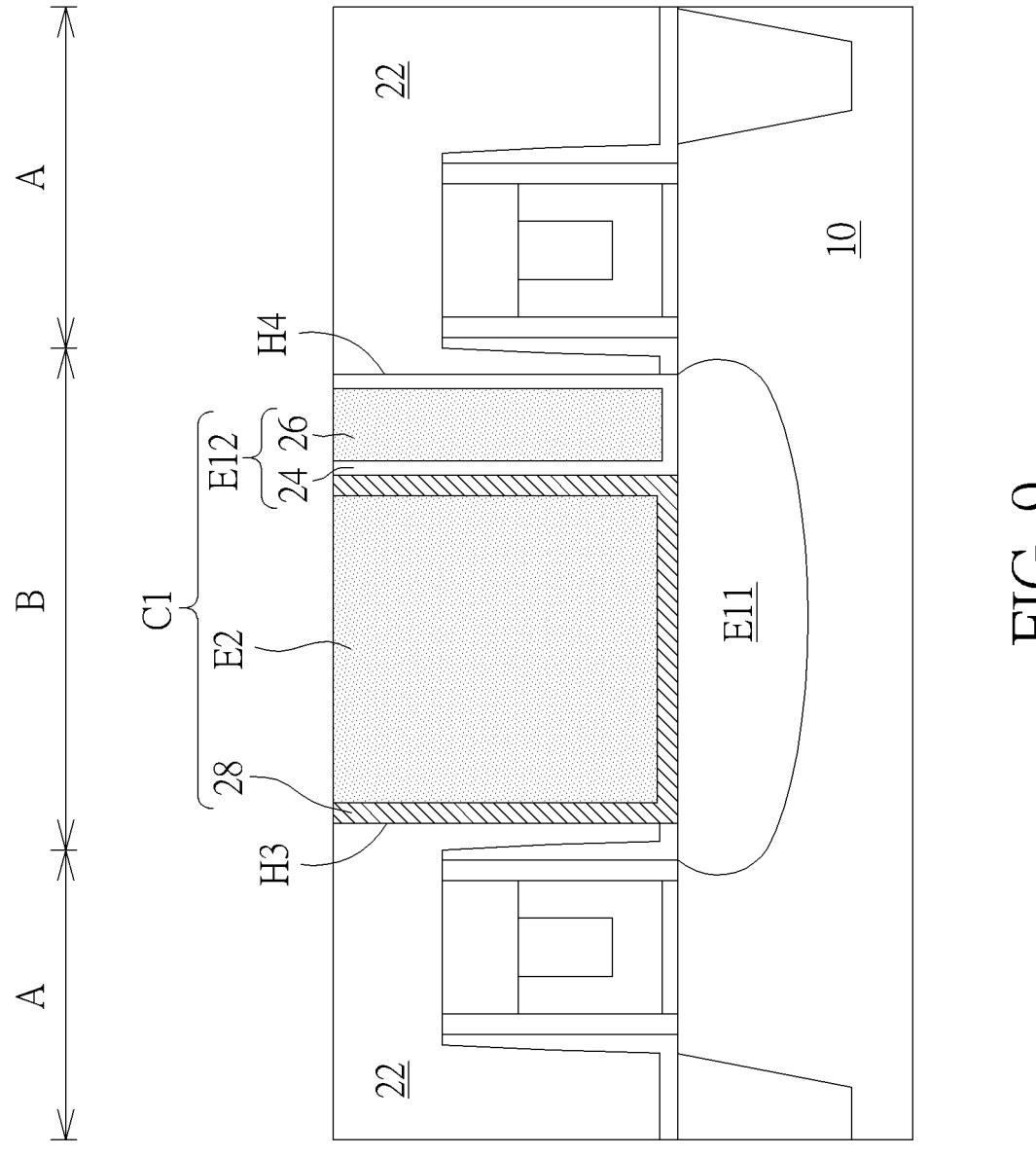
FIG. 9 depicts a capacitor on a fin structure according to a second preferred embodiment of the present invention.

FIG. 9 depicts a capacitor on a fin structure according to a second preferred embodiment of the present invention, wherein elements which are substantially the same as those in the embodiment of FIG. 8 are denoted by the same reference numerals; an accompanying explanation is therefore omitted. The difference between the capacitor C1 on a fin structure in FIG. 9 and the capacitor C on a fin structure in FIG. 8 is that the capacitor dielectric layer 28 in FIG. 9 contacts the first electrode E12. That is, there is no dielectric layer 22 between the first electrode E12 and the second electrode E2. Therefore, the sidewall of the capacitor dielectric layer 28 contacts the barrier 24 of the first electrode E12. In this way, the capacitance of the capacitor C1 can be formed between the second electrode E2, the capacitor dielectric layer 28 and the first electrode extension E11, and the capacitance of the capacitor C1 can also be formed between the second electrode E2, the capacitor dielectric layer 28 and the first electrode E12.

Figure 10:
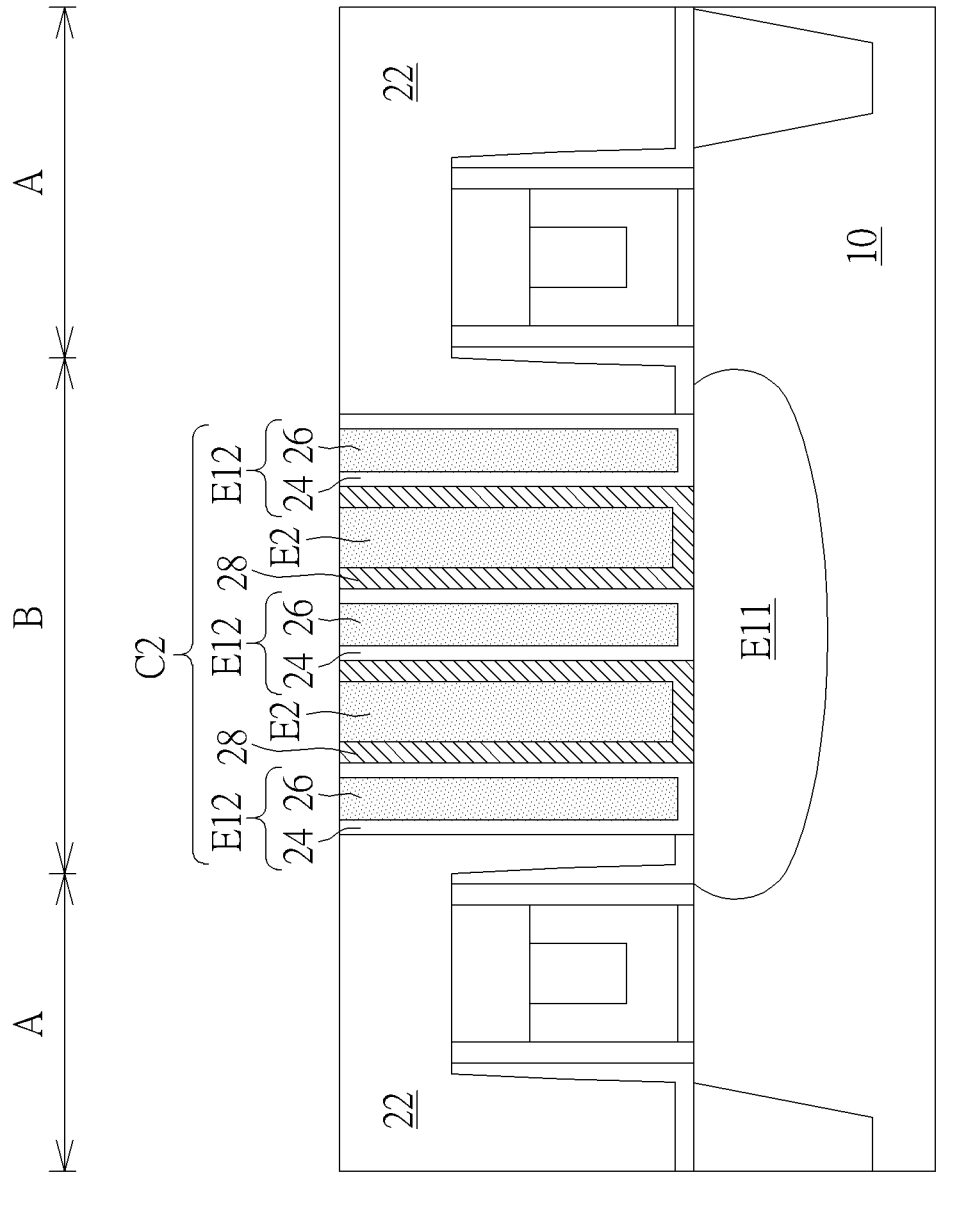
FIG. 10 depicts a capacitor on a fin structure according to a third preferred embodiment of the present invention.

FIG. 10 depicts a capacitor on a fin structure according to a third preferred embodiment of the present invention, wherein elements which are substantially the same as those in the embodiment of FIG. 8 are denoted by the same reference numerals; an accompanying explanation is therefore omitted. The difference between the capacitor C2 on a fin structure in FIG. 10 and the capacitor C on a fin structure in FIG. 8 is that there are numerous second electrodes E2 and numerous capacitor dielectric layers 28 disposed within the dielectric layer 22. Each of the second electrodes E2 is surrounded by one of the capacitor dielectric layers 28. Furthermore, numerous first electrodes E12 are also disposed within the dielectric layer 22 in FIG. 10, and all the first electrodes E12 penetrate the dielectric layer 22 and contact the first electrode extension E11. The first electrodes E12 do not contact each other. Two sides of every second electrode E2 respectively have one of the first electrodes E12. Therefore, the capacitor dielectric layers 28 on the sidewall of the second electrode E2 contacts one of the first electrodes E12. All the first electrodes E12 are electrically connected with each other, and all the second electrodes E2 are electrically connected with each other. In this way, capacitance can be further increased.

In the present invention, a plate capacitor is disposed on the fin structure to replace a MOS capacitor. In this way, the step of implanting dopants with high concentration is not needed, and the damage of the fin structure can be prevented. Furthermore, the capacitor on a fin structure of the present invention can provide more stable capacitance comparing to a MOS capacitor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A capacitor on a fin structure, comprising:
a fin structure;
two gates disposed on the fin structure;
a dielectric layer covering the fin structure;
a capacitor disposed on the fin structure and between the two gates, wherein the capacitor comprises:
a first electrode extension embedded within the fin structure;
a first electrode penetrating the dielectric layer and contacting the first electrode extension;
a second electrode disposed within the dielectric layer;

6 a capacitor dielectric layer disposed within the dielectric layer and the capacitor dielectric layer surrounding the second electrode, wherein the capacitor dielectric layer is between the second electrode and the first electrode extension.

2. The capacitor on a fin structure of claim 1, wherein the first electrode extension comprises a doped region or an epitaxial layer.

3. The capacitor on a fin structure of claim 1, wherein the first electrode comprises a metal layer and a barrier.

4. The capacitor on a fin structure of claim 1, further comprising a plurality of the first electrodes disposed within the dielectric layer, wherein each of the plurality of the first electrodes penetrates the dielectric layer and contacts the first electrode extension, and each of the plurality of the first electrodes does not contact each other.

5. The capacitor on a fin structure of claim 1, further comprising a plurality of the second electrodes and a plurality of the capacitor dielectric layers disposed within the dielectric layer, wherein each of the plurality of the second electrodes is surrounded by one of the plurality of the capacitor dielectric layers.

6. The capacitor on a fin structure of claim 1, wherein a first direction is parallel to a top surface of the fin structure, along the first direction, there is no gate between the first electrode and the second electrode.

7. The capacitor on a fin structure of claim 1, wherein the capacitor dielectric layer physically contacts the first electrode extension.

8. The capacitor on a fin structure of claim 1, further comprising two spacers respectively disposed at two sides of one of the gates, wherein the first electrode extension overlaps one of the two spacers.

* * * * *